(12) United States Patent
Kondo et al.

(10) Patent No.: US 6,215,101 B1
(45) Date of Patent: Apr. 10, 2001

(54) ELECTRICAL UNIT

(75) Inventors: Hiroyuki Kondo; Satoshi Ishikawa, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/551,350

(22) Filed: Apr. 18, 2000

(30) Foreign Application Priority Data

Jun. 15, 1999 (JP) ................................................ 11-168002

(51) Int. Cl.$^7$ ...................................................... H05B 1/00
(52) U.S. Cl. ............................................ 219/201; 174/52.1
(58) Field of Search ................................... 219/200, 201, 219/209, 507, 536, 537, 541, 548; 338/22 R, 234, 236, 225 D; 337/196, 197; 361/106–109; 174/52.1, 52.6; 439/395–400, 404–409, 417, 736, 752, 604–606

(56) References Cited

U.S. PATENT DOCUMENTS 5,057,650 * 10/1991 Urushibata et al. ............... 174/88 R
5,793,277 * 8/1998 Ichikawa et al. .................. 338/22 R
5,892,413 * 4/1999 Okimura .............................. 333/100
6,068,523 * 5/2000 Takahashi ............................ 439/736

FOREIGN PATENT DOCUMENTS 61-93719   6/1986  (JP) .
3-235610  10/1991  (JP) .

\* cited by examiner

Primary Examiner—Tu Ba Hoang
(74) Attorney, Agent, or Firm—Armstrong, Westerman, Hattori, McLeland & Naughton

(57) ABSTRACT

An electrical unit is provided, in which a damage caused by catching fire of heat-generating components therein is minimized without raising a molding cost of a terminal-attached cover of the electrical unit, thereby improving a quality of the electrical unit. The electrical unit contains a terminal-attached cover that covers a plurality of heat-generating components mounted on a circuit board. The terminal-attached cover contains a base, surrounding walls extended vertically downwardly from peripheries of the base, and terminals that penetrate the base and stick out up and down, wherein the terminal-attached cover made of flameproof resin is integrally molded.

3 Claims, 9 Drawing Sheets

ELECTRICAL UNIT

BACKGROUND OF THE INVENTION (1) Field of the Invention

This invention relates to an electrical unit containing heat-generating components inside.

(2) Description of the Related Art

Usually, an internal circuit, such as an electrical unit 100 as shown in FIG. 9, is installed in an electric connection box.

The electrical unit 100 includes a circuit board 10, heat-generating components 20 soldered to a wiring pattern (not shown) on the circuit board 10, and four terminal-attached covers 130 attached to the circuit board 10.

On the circuit board 10, there are formed slits 11 and V-shape cuts 12.

Each heat-generating component, 20 is a component such as a relay 21, a positive temperature coefficient (hereinafter, PTC) element 22 and a transistor 23. The PTC element increases its own electrical resistance to prevent a current from flowing into the circuit when an overcurrent takes place in the circuit.

The terminal-attached cover 130 contains a base 131 made of synthetic resin, legs 132 for screwing the terminal-attached cover 130 on the base 131, which are integrally molded with the base 131, and the terminals 133 that penetrate the base 131 and stick out up and down. The heat-generating components 20 electrically connected to the circuit board 10 are covered with the terminal-attached cover 130 that is screwed on the circuit board 10 by screws 60 inserted into the legs 132.

After the heat-generating components 20 are placed on the circuit board 10, four terminal-attached covers 130 are mounted on the circuit board 10. The heat-generating components 20 are soldered on the circuit board 10 by using an automatic soldering machine, then the circuit board 10 is divided into four parts by cutting along the slits 11 and V-shape cuts 12. Thus, four identical electrical units are produced at a time.

A design is disclosed in Japanese Utility Model Application Laid-Open No. S61-93719, in which a circuit board 141 is covered with a cover member 140 (corresponding to the above terminal-attached cover 130) made of flameproof resin as shown in FIG. 10. A part 143 installs an electrical unit 100' therein.

An invention is disclosed in Japanese Patent Application Laid-Open No. H3-235610, in which the cover member 140 is made of a material having high thermal conductivity prepared by mixing an inorganic material into a resin. A large amount of (50 wt % or more) glass fibers is mixed into polybutylene terphthalate (hereinafter, PBT) in order to increase the thermal conductivity.

If a heat-generating component 20 catches fire caused by a heat generation, there is a danger that the terminal-attached covers 130 might burn if the resin that is used to make the terminal-attached covers 130 is not flameproof, causing deterioration in quality of the electrical unit 100. When the heat-generating component 142 catches fire and falls down to be in contact with another heat-generating component 142', there is a danger that the heat-generating component 142' also might catch fire if no measure to prevent the heat-generating component 142 shown in FIG. 10 from falling down is taken, causing deterioration in quality of the electrical unit 100.

When the cover member 140 is made of a material having high thermal conductivity prepared by mixing a large amount of an inorganic material into a resin, there is no problem with respect to the material itself of the cover member 140, however a cost of molding the cover member 140 increases since a molding condition thereof becomes severe.

SUMMARY OF THE INVENTION

It is therefore an objective of the present invention to solve the above problem and to provide an electrical unit, in which damage caused by heat-generating components catching fire therein is minimized without raising the molding cost of a terminal-attached cover of the electrical unit, thereby improving a quality of the electrical unit.

In order to attain the above objective, the present invention provides an electrical unit containing a terminal-attached cover that covers a plurality of heat-generating components mounted on a circuit board, the terminal-attached cover comprising: a base; surrounding walls extended vertically downwardly from peripheries of the base; and terminals that penetrate the base and stick out up and down, wherein the terminal-attached cover made of flameproof resin is integrally molded. Therefore, even if the heat-generating component catches fire, the terminal-attached cover will hardly burn, thereby preventing the fire from spreading.

One or a plurality of partitioning walls for setting the heat-generating components apart from each other are attached to the back of the base so as to prevent the heat-generating components from coming into contact with each other caused by falling down of the heated heat-generating component. Therefore, even if the heat-generating component catches fire and starts to fall, the partitioning wall prevents the heat-generating component from coming into contact with a neighboring heat-generating component.

At least one supporting rib is attached to the back of the base around the heat-generating components. Therefore, upon starting to fall, the burning heat-generating component abuts on the supporting rib, resulting in its not falling down.

Preferably, a plurality of pairs of the supporting ribs are arranged in such a manner that a pair of the supporting ribs facing with each other puts the heat-generating component therebetween. Therefore, the supporting ribs prevent the heat-generating component from falling.

Thus, in the electrical unit according to the present invention, damage caused by the burning of heat-generating components therein is minimized without raising the molding cost of a terminal-attached cover of the electrical unit, thereby improving a quality of the electrical unit.

DESCRIPTION OF THE PREFERRED EMBODIMENTS

In the following, the preferred embodiments of the present invention are explained with reference to the attached drawings.

FIGS. 1 to 8 show an embodiment of an electrical unit according to the present invention. In the following, identical constituents of the present invention with respect to the conventional constituents are attached the same coding number and explanation thereof are omitted.

Figure 1:
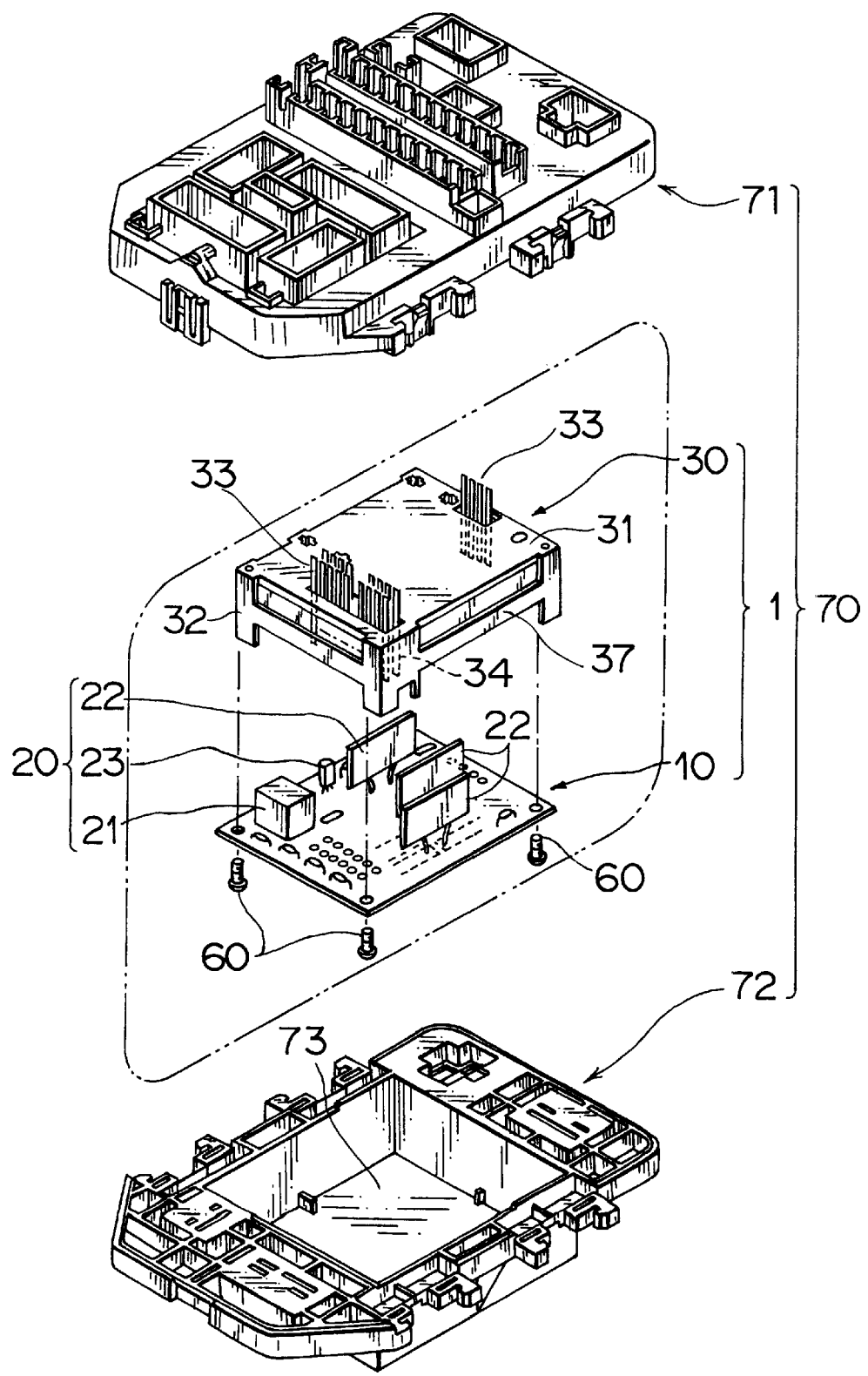
FIG. 1 is an exploded perspective view illustrating an embodiment of an electrical unit according to the present invention.

As shown in FIG. 1, the electrical unit 1 includes a circuit board 10 having a wiring pattern that is not shown in the figure, a plurality of heat-generating components 20 soldered to the wiring pattern, and a terminal-attached cover 30 screwed on the circuit board 10 in such a manner that the terminal-attached cover 30 covers the heat-generating components 20.

Each heat-generating component 20 is a component such as a relay 21, a PTC element 22 and a transistor 23. Other examples may be such as an overcurrent protective element, an overvoltage protective element, a Zener diode, a varistor, a thermistor or a capacitor. Similarly to the conventional example, a relay 21, three PTC elements 22 and a transistor 23 may be arranged on each circuit board 10 corresponding to one terminal-attached cover 30.

As shown in FIG. 1, the terminal-attached cover 30 contains a rectangular base 31 that covers the circuit board 10, surrounding walls 37 extended vertically downwardly from the peripheral sides of the base 31, and one or a plurality of terminals 33 and 34 that penetrate the base 31 and stick out up and down.

The terminal-attached cover 30 is made of flameproof resin that is, for example, a material of PBT mixed with 0 to 30 wt % of glass fibers, by use of which a molding thereof can be easily carried out by employing a metal mold used in the normal molding of resin.

On the other hand, a material of PBT mixed with 40 to 50 wt % of glass fibers cannot be molded by employing a metal mold for a use in normal molding of resin because the material of PBT mixed with 40 to 50 wt % of glass fibers does not (readily) flow into a normal metal mold due to its high viscosity. If the material of PBT mixed with 40 to 50 wt % of glass fibers is to be used, a metal mold having a special structure is needed causing an increase in molding cost.

Figure 2A:
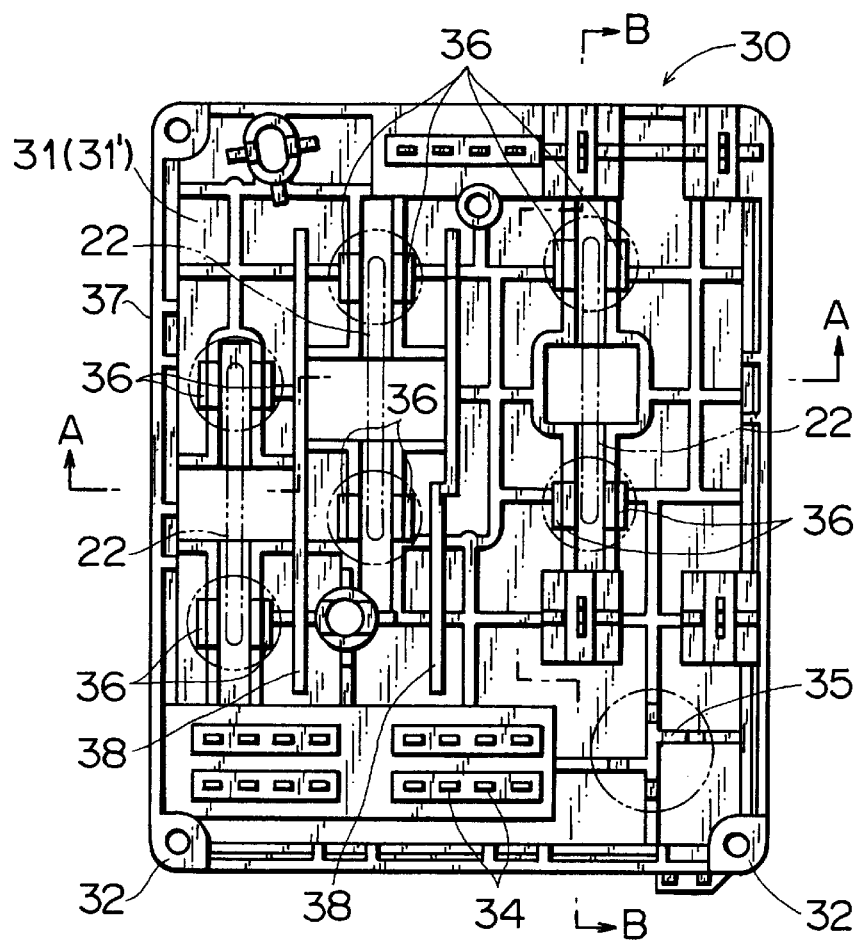
FIG. 2A illustrates the back of a terminal-attached cover in FIG. 1.
Figure 2B:
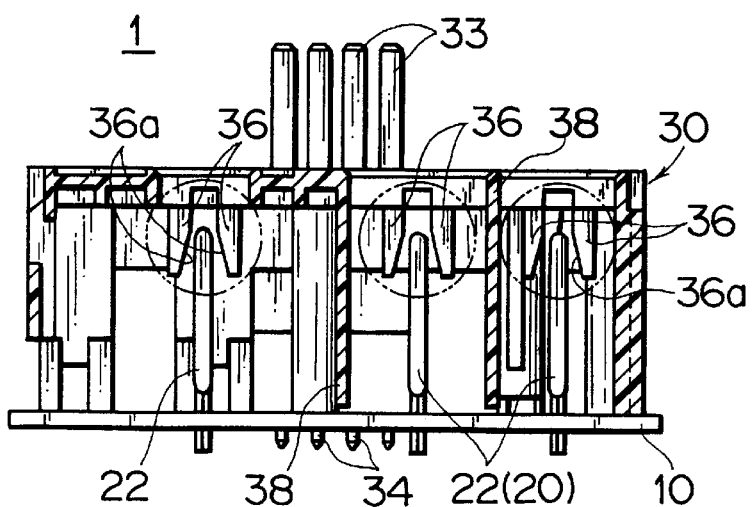
FIG. 2B is a cross sectional view taken along line A—A in FIG. 2A when the terminal-attached cover is screwed on a circuit board.

As shown in FIGS. 2A and 2B, legs 32 for receiving screws 60 are placed at three corners and a central portion of a front end of the base 31, while the terminals 33 and 34 are situated at both ends of the base 31.

On the back 31' (a face covering the heat-generating components) of the base 31, partitioning walls 38 for setting the PTC elements 22 apart from each other, supporting ribs 36 for the PTC elements 22 and a pressing rib 35 for the relay 21 are integrally molded.

The two partitioning walls 38 are arranged on the back 31' situating between the three PTC elements 22, as shown in FIGS. 2A and 2B. Therefore, for example, when the central PTC 22 in the figures catches fire caused by an overcurrent, the partitioning walls 38 prevent the central PTC 22 from falling down to be in contact with either the left side PTC element 22 or the right side PTC element 22. Here, a shape and/or a position of the partitioning walls 38 is optional as long as the partitioning walls 38 can set the PTC elements apart from each other.

Each space surrounded by the base 31, the surrounding walls 37 and the partitioning walls 38 nearly covers the corresponding PTC element 22, thereby the PTC element 22 is set apart from the open air. Therefore, even if the PTC element 22 catches fire, at least a fire of the terminal-attached cover 30 is suppressed when oxygen in said space is all consumed.

Figure 3:
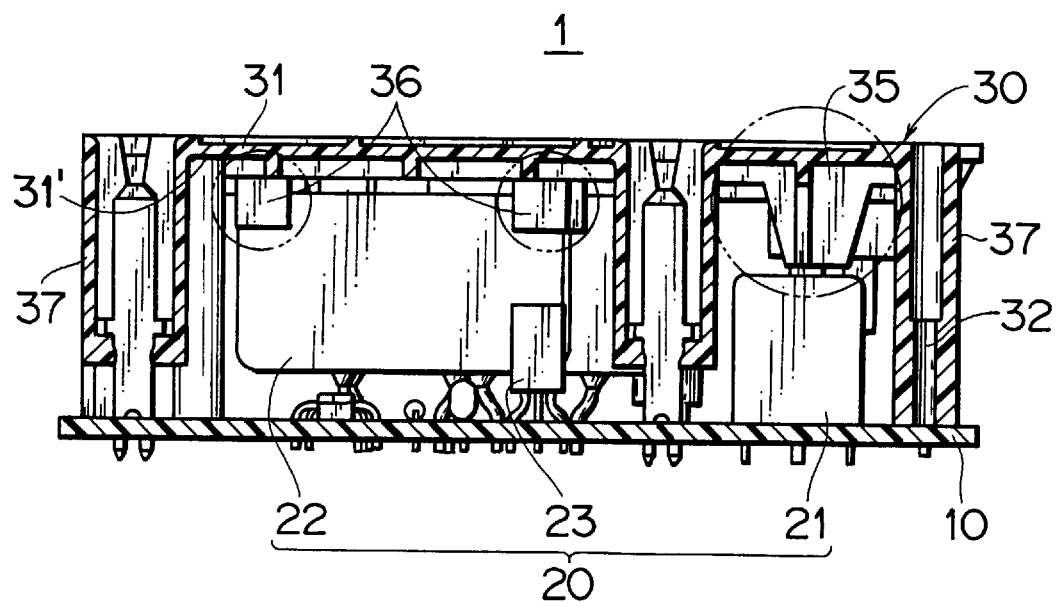
FIG. 3 is a cross sectional view taken along line B—B in FIG. 2A when the terminal-attached cover is attached to a circuit board.

As shown in FIGS. 2A, 2B and 3, two pairs of the supporting ribs 36 are arranged on the back 31' where the PTC element 22 is situated. That is, each pair of the supporting ribs 36 is arranged at front and rear ends in the direction of the length of the PTC element 22. Here, the supporting ribs 36 may be arranged in an optional position with respect to the both sides of the PTC element 22. Further, a pair, or more than two pairs, of the supporting ribs 36 may be arranged at desired positions.

Since a plurality of pairs of the supporting ribs 36 are integrally molded on the back 31' of the base 31, even when the PTC element 22 catches fire, the supporting rib 36 prevents the PTC element 22 from falling down. That is, even if a solder that supports the PTC element 22 melts caused by successive flowing of an overcurrent into the circuit board 10, the fired PTC element 22 is prevented from falling down. Further, the PTC element 22 does not drop off from the circuit board 10. Furthermore, each pair of the supporting ribs 36 securely prevents the PTC element 22 from falling down, thereby preventing a fire caused by falling of the fired PTC element 22 from spreading. Here, each pair of the supporting ribs 36 is to abut on the PTC element 22 so as to prevent the PTC element 22 from falling down and is not to make it to stand up again.

Each pair of the supporting ribs 36 has a pair of inclined faces 36a facing each other, as shown in FIG. 2B. Therefore, when the terminal-attached cover 30 is placed on the circuit board 10, the PTC elements 22 can be smoothly guided between each pair of the supporting ribs 36.

As mentioned above, upon the PTC elements 22 catching fire, the partitioning wall 38 prevents the PTC elements 22 from coming into contact with each other caused by a falling of the PTC element 22, further the supporting ribs 36 can prevent the PTC elements 22 from falling. Therefore, a fire that might occur caused by the falling of the burning PTC element 22 is doubly prevented from occurring.

In the following, a process for producing the electrical unit 1 is explained.

Figure 4:
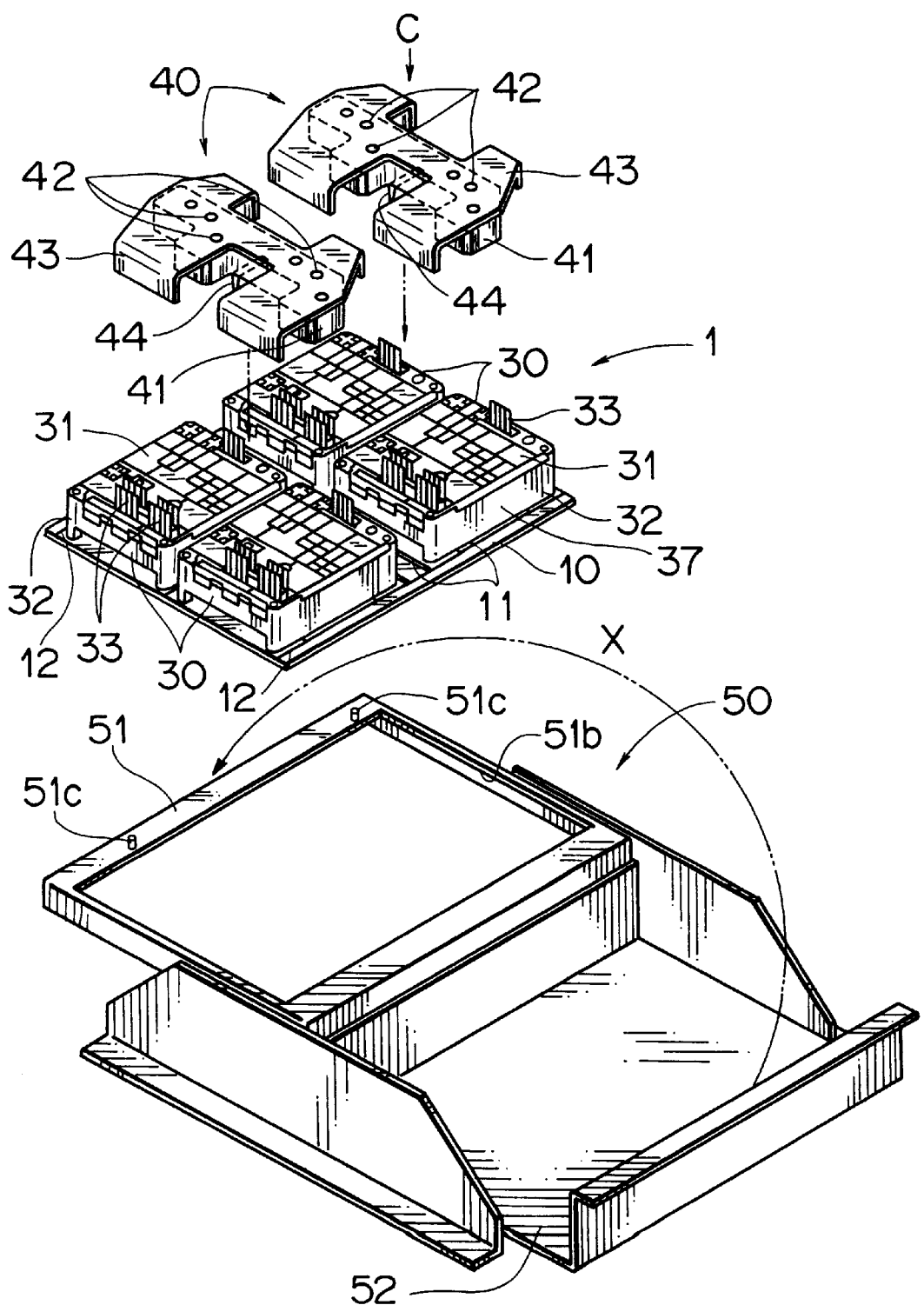
FIG. 4 illustrates a screwing jig and jigs for pressing PTC elements that are used to produce the electrical unit shown in FIG. 1.

As shown in FIG. 4, a screwing jig 50 is put on a workbench that is not shown in the figure. The circuit board 10 is placed on a board station 51 of the screwing jig 50 and fixed by projections 51c. The relay 21, the PTC elements 22 and the transistor 23 are placed on their prescribed positions on the circuit board 10.

Figure 6:
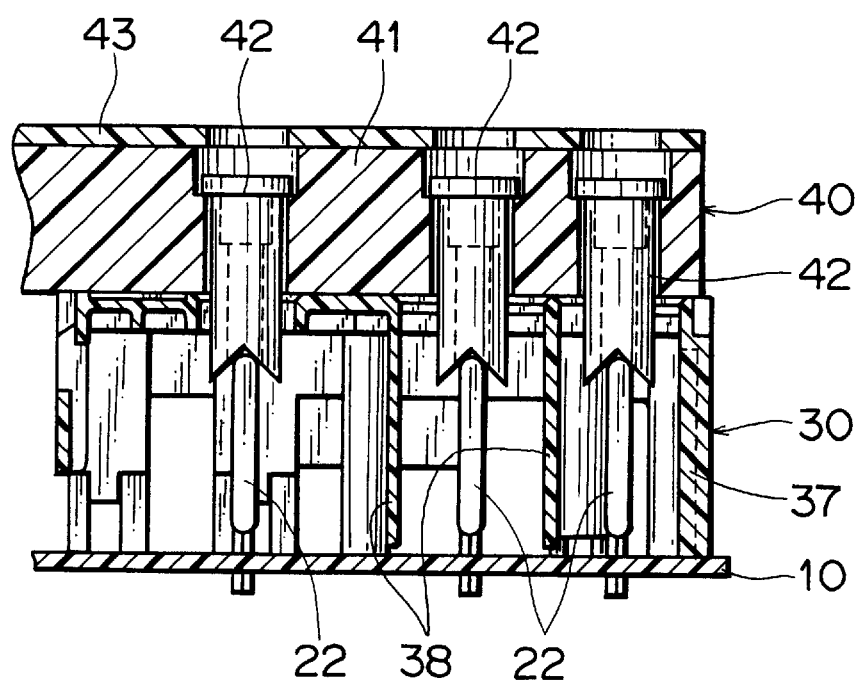
FIG. 6 is a cross sectional view taken along line D—D in FIG. 5.
Figure 5:
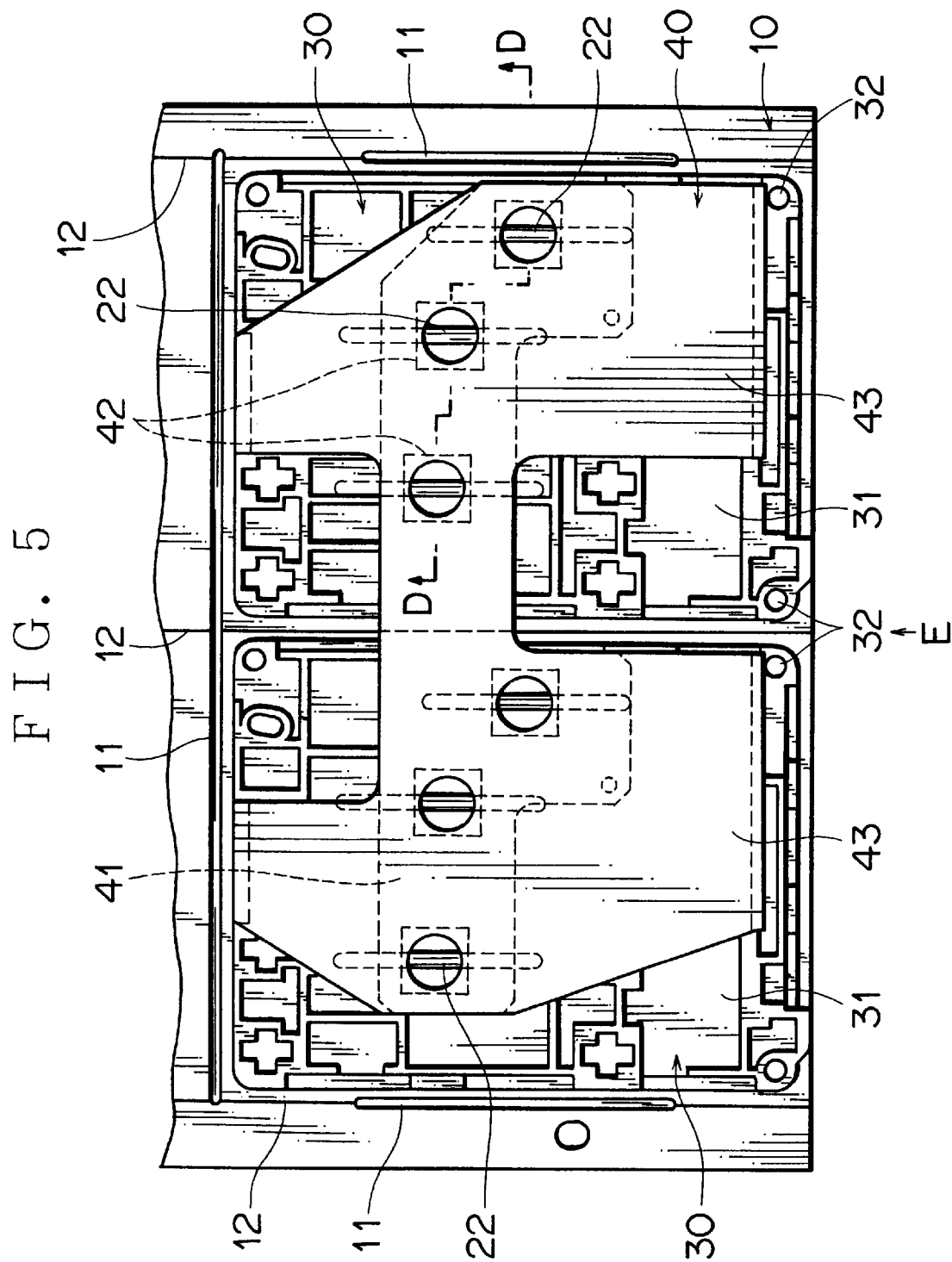
FIG. 5 is a view as seen from the C direction of FIG. 4 illustrating an appearance that the jig for pressing PTC elements is placed on the terminal-attached cover.
Figure 7:
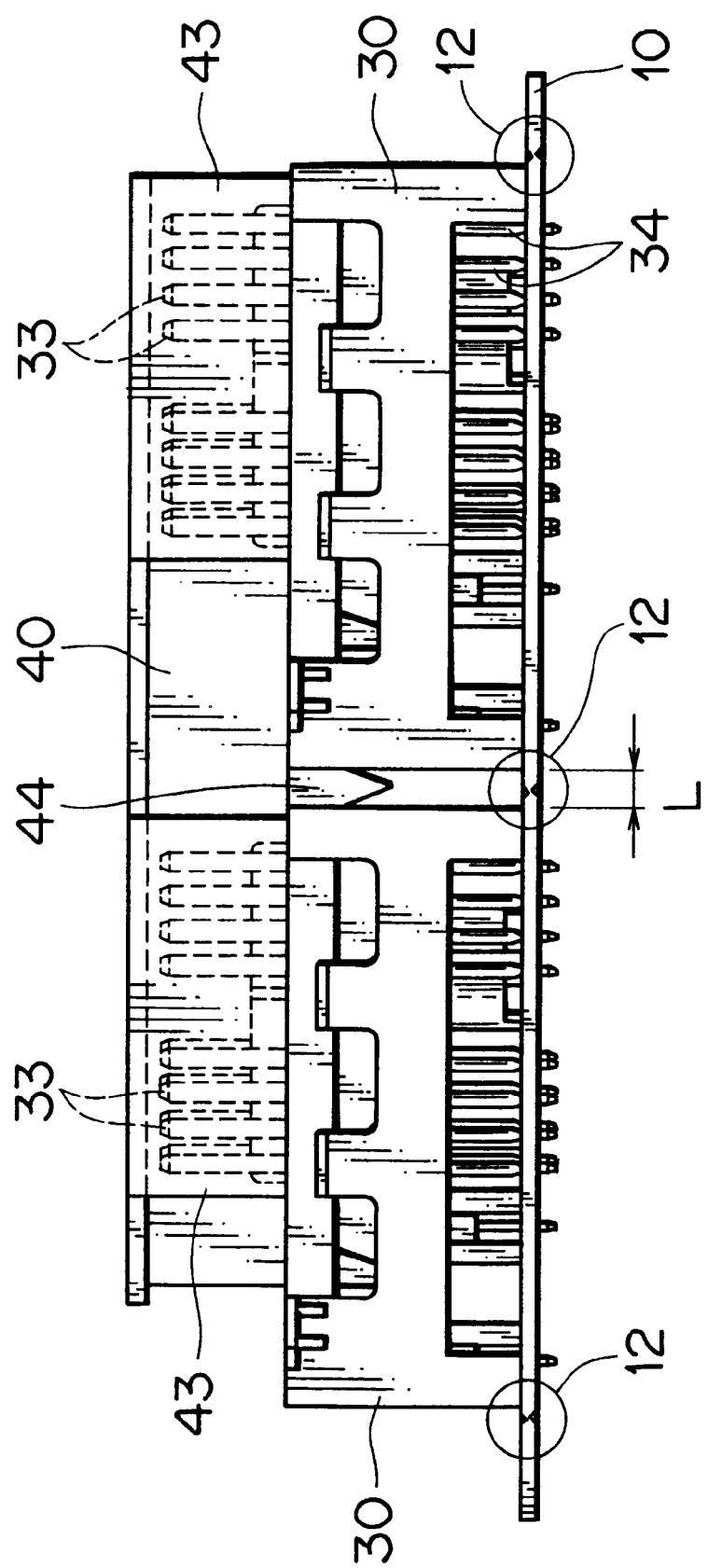
FIG. 7 is a view as seen from the E direction of FIG. 5.

The four terminal-attached covers 30 are placed on the circuit board 10. At this time, each PTC element 22 is situated between a corresponding pair of the supporting ribs 36. As shown in FIGS. 4 and 5, a jig 40 for pressing PTC elements is placed straddling the two terminal-attached covers 30. As shown in FIGS. 5 and 6, each pusher 42 protrusively provided on a block 41 of the jig 40 for pressing PTC elements holds a central portion of the corresponding PTC element 22. As shown in FIG. 7, a terminal cover 43 covers terminals 33 stuck out from the terminal-attached covers 30 and a spacer 44 is inserted into a gap L between the two terminal-attached covers 30. As shown in FIG. 4, the four terminal-attached covers 30 are divided into two sets by the two jigs 40 for pressing PTC elements.

Figure 8:
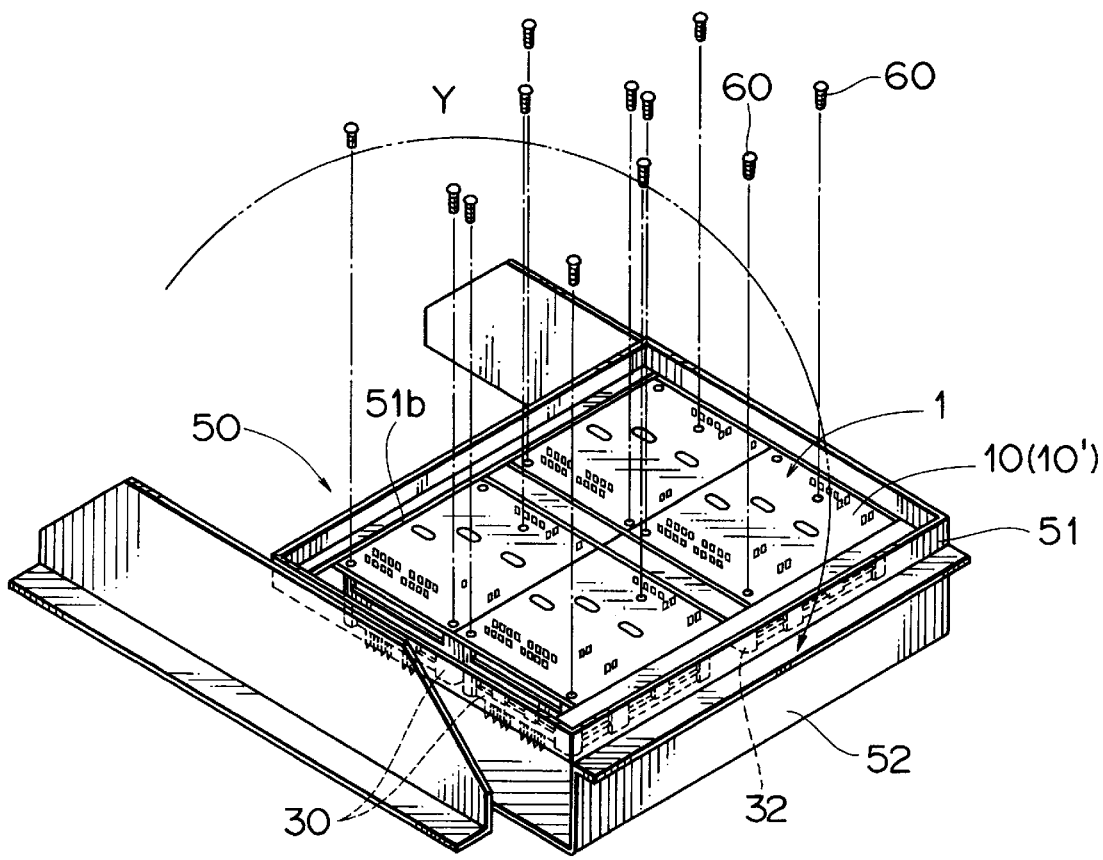
FIG. 8 illustrates an appearance that the circuit board and the terminal-attached cover mounting the jigs for pressing PTC elements thereon are placed on the screwing jig and then, that the screwing jig is turned over.
Figure 9:
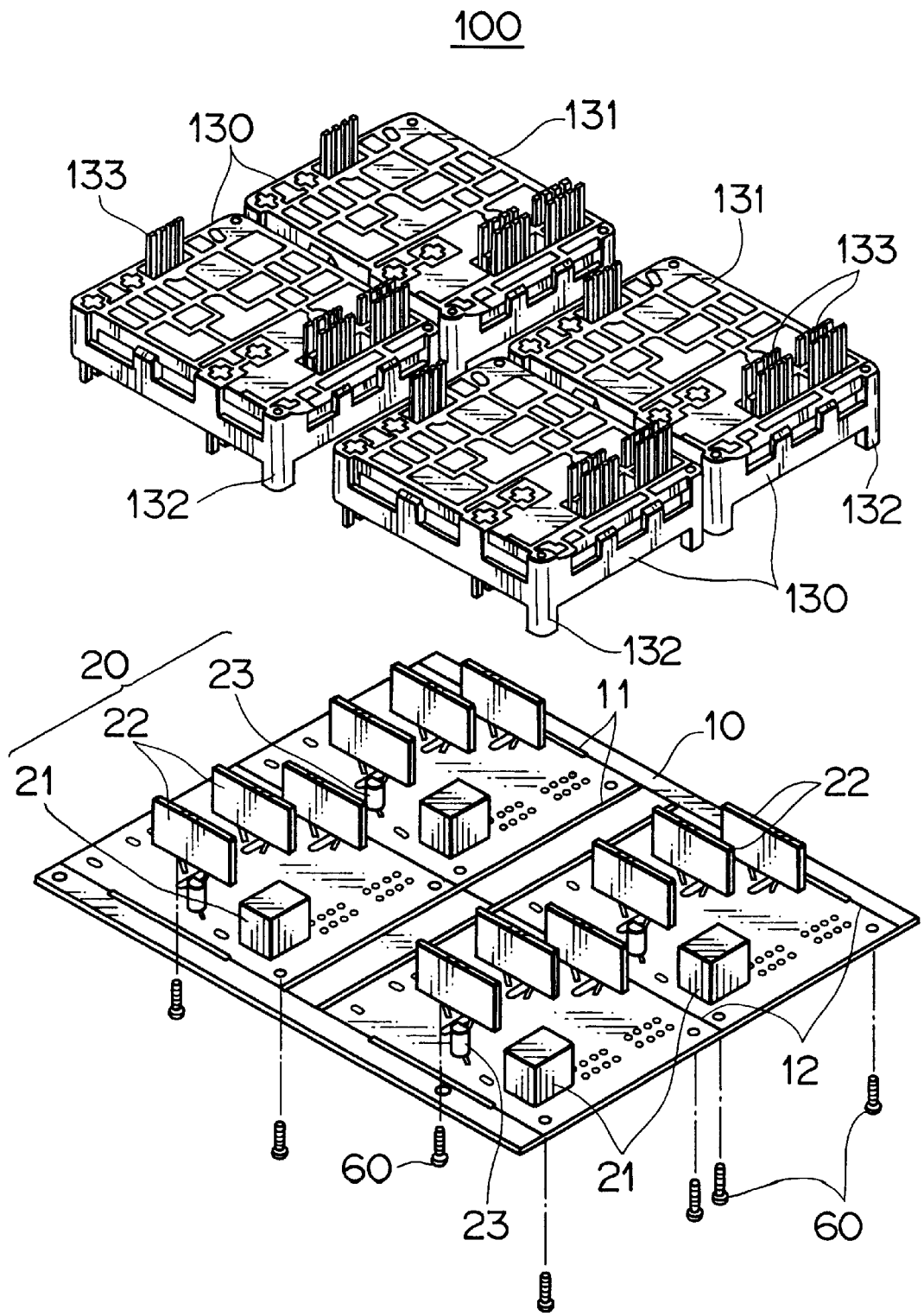
FIG. 9 is a perspective view illustrating a conventional electrical unit.
Figure 10:
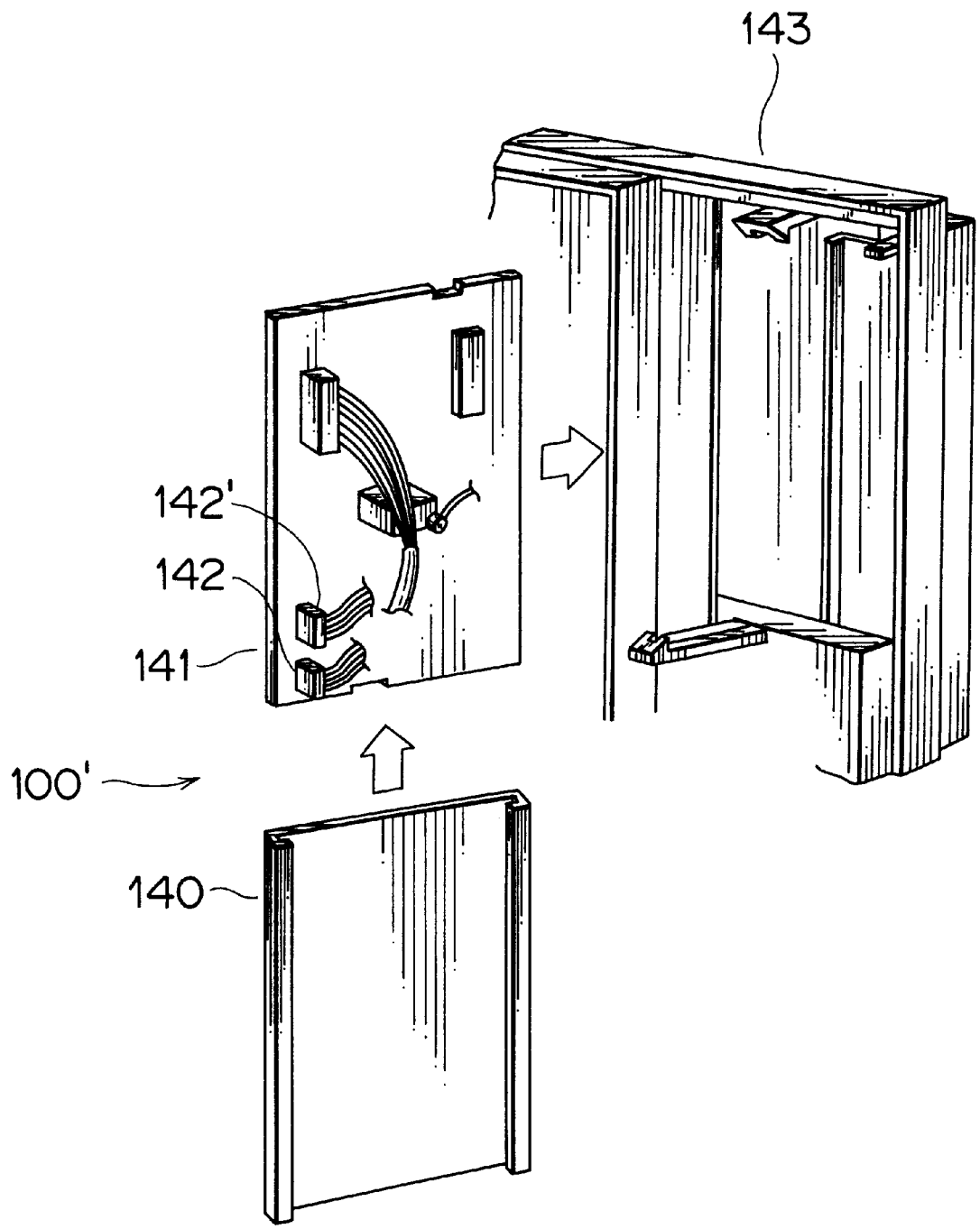
FIG. 10 is a perspective view illustrating another conventional electrical unit.

As shown in FIG. 4, a top plate 52 of the screwing jig 50 is turned to the X direction so that the top plate 52 covers and abuts on the jigs 40 for pressing PTC elements. Then, as shown in FIG. 8, the screwing jig 50 is turned over to the Y direction so that the back 10' of the circuit board 10 and each leg 32 of the four terminal-attached covers 30 is screwed to each other by screws 60. Slits 51b of the board station 51 help this work of screwing to be carried out.

Then, the circuit board 10 and the terminal-attached covers 30 screwed to the circuit board 10 are removed from the screwing jig 50. The heat-generating components 20 are soldered (electrically connected) to a wiring pattern on the circuit board 10 by an automatic soldering machine.

As shown in FIG. 4, the jigs 40 for pressing PTC elements are removed from the terminal-attached covers 30 after the soldering is finished. The circuit board 10 is divided into four parts by cutting along slits 11 and V-shape cuts 12, whereby four identical electrical units 1 are produced at a time.

After the electrical unit 1 is produced, it is received into a space 73 of a lower casing 72, then covered with an upper casing 71 and then, the upper and lower casing are combined together by, for example, locking means, therefore an electric connection box 70 containing the electrical unit 1 as an internal circuit is produced.

In the electrical unit according to the present invention, since the terminal-attached cover made of flameproof resin is integrally molded, the terminal-attached cover will hardly burn. Consequently, even if the heat-generating component catches fire caused by an overcurrent flowing into the circuit board, the terminal-attached cover is hardly affected by the catching fire of the heat-generating component, that is, a spreading of the fire from the terminal-attached cover can be prevented from occurring. Further, compared to the conventional example, no special condition for molding the terminal-attached cover is required, resulting in that a quality of the terminal-attached cover from the viewpoint of prevention of the fire from spreading is improved without making a molding condition severe, compared to the conventional example.

Further, according to the present invention, one or a plurality of partitioning walls for setting the heat-generating components apart from each other are attached to the back of the base so as to prevent the heat-generating components from coming into contact with each other caused by falling down of the heated heat-generating component. Therefore, even if the heat-generating component catches fire and starts to fall, the partitioning wall prevents the heat-generating component from coming into contact with a neighboring heat-generating component. In detail, a contact between a burning heat-generating component and the a non-burning heat-generating component is prevented, in addition, a contact between the burning heat-generating components with each other is also prevented. Therefore, burning of the terminal-attached cover caused by a contact between the heat-generating components with each other can be prevented from occurring.

Furthermore, a nearly closed space set apart from the open air can be formed by partitioning with the base, the surrounding walls and the partitioning walls in the terminal-attached cover, thereby a fire in the terminal-attached cover is suppressed at least when oxygen in the space is all consumed, even if the PTC element catches fire.

In addition, according to the present invention, at least one supporting rib is attached to the back of the base around the heat-generating components, thereby upon starting to fall, the burning heat-generating component abuts on the supporting rib, resulting in that the heat-generating component does not fall down. Further, the fired heat-generating component is prevented from dropping off from the circuit board by falling down, thereby a fire is prevented from spreading from the heat-generating component to the terminal-attached cover.

Furthermore, according to the present invention, since a plurality of pairs of the supporting ribs are arranged in such a manner that a pair of the supporting ribs puts the heat-generating component therebetween facing with each other, the supporting ribs securely prevent the burning heat-generating component from falling.

To sum up, even if the heat-generating component catches fire, the partitioning wall prevents the heat-generating component from coming into contact with each other caused by falling, further the supporting ribs can prevent the heat-generating component from falling. Therefore, a fire of the terminal-attached cover, which might occur caused by the falling of the heat-generating component, is doubly prevented from occurring.

The aforementioned preferred embodiments are described to aid in the understanding of the present invention and variations may be made by one skilled in the art without departing from the spirit and scope of the present invention.

What is claimed is:

1. An electrical unit containing a terminal-attached cover that covers a plurality of upstanding heat-generating components mounted on a circuit board, the terminal-attached cover comprising:

a base integrally molded from flameproof resin;

surrounding walls of said base extending vertically downwardly from a periphery of the base; and terminals penetrating the base and extending therefrom up and down, wherein at least one partitioning wall for separating the heat-generating components apart from each other is attached to the back of the base, said at least one partitioning wall being spaced from adjacent heat-generating components so as to prevent said heat-generating components from coming into contact with each other upon falling from said upstanding mounting.

2. The electrical unit according to claim 1, wherein at least one supporting rib is attached to the back of the base around the heat-generating components, said supporting rib being operative to engage said adjacent heat-generating component so as to prevent the heat-generating component from falling down.

3. The electrical unit according to claim 2, wherein a plurality of pairs of supporting ribs are arranged facing each other in such a manner that each heat-generating component is disposed between a pair of said supporting ribs.

* * * * *